United States Patent
Chen et al.

(10) Patent No.: US 6,950,181 B2
(45) Date of Patent: Sep. 27, 2005

(54) OPTICAL WAFER PRESENCE SENSOR SYSTEM

(75) Inventors: Ho-Jen Chen, Tucheng (TW); Ton-Lee Lee, Hsin-Chu (TW); Ko-Chin Chung, Taipei (TW); Fan-Lin Lu, Chung-Ho (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 370 days.

(21) Appl. No.: 10/404,872

(22) Filed: Mar. 31, 2003

(65) Prior Publication Data

US 2004/0189986 A1 Sep. 30, 2004

(51) Int. Cl.⁷ .................................................. G01J 1/42
(52) U.S. Cl. .................................... 356/218; 356/237.2
(58) Field of Search ................................. 356/128, 218, 356/237.1, 237.2, 237.3, 600–604, 612; 250/442.1, 491.21, 518, 561, 492.2; 364/478.06, 167.01

(56) References Cited

U.S. PATENT DOCUMENTS

| | | | | |
|---|---|---|---|---|
| 4,636,073 A | * | 1/1987 | Williams | .................. 356/243.4 |
| 5,267,217 A | * | 11/1993 | Tokura et al. | ........... 356/237.1 |
| 5,563,798 A | * | 10/1996 | Berken et al. | .............. 700/218 |
| 5,598,345 A | * | 1/1997 | Tokura | .......................... 716/4 |
| 6,493,086 B1 | * | 12/2002 | McAndrew et al. | ......... 356/437 |

* cited by examiner

Primary Examiner—Frank G. Font
Assistant Examiner—Sang H. Nguyen
(74) Attorney, Agent, or Firm—Tung & Associates

(57) ABSTRACT

A wafer presence optical sensor system comprises a transfer chamber adapted to receive a wafer, an optical sensor comprising means emitting a sensing beam and means receiving a beam reflected from the wafer to ascertain wafer presence in the chamber, and means to reflect away the sensing beam when reaching a chamber bottom. The reflecting means includes an oblique area made in an inner surface of the chamber bottom or, alternatively, a body with an oblique area placed on the inner surface. Reflecting away the sensing beam when no wafer is present in the transfer chamber prevents the receiving means from receiving the beam reflected from the chamber bottom and thus thwarts the misinterpretation of wafer presence.

18 Claims, 2 Drawing Sheets

OPTICAL WAFER PRESENCE SENSOR SYSTEM

BACKGROUND OF THE INVENTION

1. Field of the Invention

The present invention relates generally to the process of manufacturing semiconductor devices, more particularly to sensing devices and even more particularly to wafer sensing system for use with equipment employed in fabricating integrated circuits.

2. Description of the Related Art

Fabrication of semiconductor integrated circuits (IC) is a complicated multi-step process for creating microscopic structures with various electrical properties to form a connected set of devices. As the level of integration of ICs increases, the devices become smaller and more densely packed, requiring more levels of photolithography and more processing steps. As more layers are built up on the silicon wafer, problems caused by surface non-planarity become increasingly severe and can impact yield and chip performance. During the fabrication process, it may become necessary to remove excess material in a process referred to as planarization.

A common technique used to planarize the surface of a silicon wafer is chemical mechanical polishing (CMP). CMP involves the use of a polishing pad affixed to a circular polishing table and a holder to hold the wafer face down against the rotating pad. Slurry containing abrasive and chemical additives is dispensed onto the polishing pad. The wafer and polishing pad rotate relative to each other. The rotating action, along with the abrasive and chemical additives of the slurry, results in a polishing action that removes material from the surface of the wafer. Protrusions on the surface erode more efficiently than recessed areas leading to a flattening or planarization of the wafer surface. Following CMP, the wafer must be cleaned of any CMP and slurry residue. Any residue remaining on the wafer can cause shorts in the IC devices. The wafers are loaded into a wet processing station and submerged in a water bath. The processing station contains a wafer transporter having a track, which moves the wafers by means of a water jet pushing the wafers along the track. The wafers are then pushed into a cassette-like holder having horizontal slots for each wafer. The holder is motorized moving vertically to receive the wafer in the slot as it is being shot off the wafer transporter. One or more sensors are used to track the presence of the wafers along the wafer transporter and prior to being inserted into the slots of the wafer holder.

Prior art methods employ sensors to track the presence of the wafers. U.S. Pat. No. 6,247,368 issued to Cline et al. discloses a semiconductor post-polishing processing apparatus and method employing a non-optical wafer sensor for detecting the presence of a semiconductor wafer within the processing stations. The apparatus comprises a wet processing station, a wafer transport track, and the non-optical sensor. Preferably, the non-optical wafer sensor is a transducer, and most preferably, a piezoelement, which emits and detects sound waves. The sound waves are reflected back to the emitter signaling the presence of a semiconductor wafer. The signal is sent to a receiver linked to a processor, which is adapted to move a wafer holder situated at the end of the transport track to receive a wafer in the next available empty slot of the holder. The non-optical wafer sensor is impervious to slurry and CMP residue, film build-up, bubbles, wafer color/hue variations, and other wet environment problems.

A similar situation arises in a typical process for fabricating semiconductor devices like that described in the above where, for the purpose of introducing wafers into treatment sections such as heat treatment chambers, a container carrying untreated wafers (which in general is called a "carrier" or a "cassette") is commonly conveyed by way of an inlet/outlet port into an intermediate chamber, where the wafers are taken out from the carrier by means of a conveying mechanism such as arms for the conveyance into one of the treatment chambers. The carrier has an open bottom as known, and includes on each side thereof comb-teeth-like guide grooves extending in parallel to correspondingly guide and receive the lateral edges of the wafers so as to accommodate, for example, twenty-five wafers. In order to control the conveying action of the conveying mechanism or to perform a control within the treatment chamber, detection must be made of the presence or absence of the wafers resting between the opposite guide grooves in the carrier placed at the inlet/outlet port. To this end, a wafer counter is provided.

Due to the opacity of silicon wafers, which are generally in use as semiconductor wafers, there has been hitherto used a wafer counter of a transmission type having a light emitting section comprised of a light emitting diode and a light receiving section comprised of a photo-transistor arranged respectively on one side and the other side of respective regions where the wafers are disposed, the presence or absence of the wafers being detected based on light reception signals derived from the light receiving section. However, there have been lately manufactured transparent quartz wafers consisting of LCD substrates in array. Such transparent wafer substantially transmits therethrough light sent out from the light emitting section, and hence the conventional transmission type wafer counter cannot detect whether a transparent wafer is present or absent. This is due to the following fact.

In the presence of the transparent wafer, the amount of light received by the light receiving section slightly reduces since the transparent wafer absorbs a small amount of light. Nevertheless, the light receiving section receives the light from the light emitting section irrespective of the presence or absence of the wafer. The range of output voltage levels corresponding to various light receiving states has a certain width (due to, for example, unevenness in characteristics of the photo-transistors, or influence of the disturbance light), and there is only a slight difference in light receiving amount between the "presence" and "absence". It is therefore very difficult and virtually impossible to electrically distinguish the difference. For this reason, there can be used a method of detecting the presence or absence of the transparent wafer with the aid of microswitches or the like. Since a contact type is employed in this case, the microswitches may possibly contaminate the wafers, or damage the peripheries of the wafers.

In U.S. Pat. No. 5,354,995 issued to Endo et al., disclosed is a device for detecting a semiconductor wafer in a non-contact manner irrespective of transparency or opacity thereof. At positions corresponding to a plurality of wafers loaded on a carrier, a plurality of light emitting/receiving sensors and a plurality of light receiving sensors are correspondingly provided in pairs in such a manner that their respective light emitting/receiving surfaces and their respective light receiving surface in pairs confront each other. The light emitting/receiving sensors and light receiving sensors are alternately arranged in two rows lengthwise on a sensor support board. In the case of a transparent wafer, a light sent out from a light emitting section of the light emitting/ receiving sensor strikes on and is reflected by the surface of the wafer. The light thus reflected is then detected by a light receiving section of the same light emitting/receiving sensor. In the presence of an opaque wafer, a light sent out from the light emitting/receiving sensor is not permitted to reach the confronting light receiving sensor. Conversely, in the absence of the opaque wafer, the light reaches the light receiving sensor for detection. On the other hand, there is provided a judgment section switchably inputting one of a light reception signal generated at the light receiving section of the light emitting/receiving sensor and a light reception signal generated at the light receiving section of the light receiving sensor.

As discussed in the above, semiconductor wafer fabrication is a type of industrial processing operations that requires automated transfer of articles undergoing processing between successive processing stations. In semiconductor wafer fabrication, a semiconductor wafer is transferred between various processing units, each unit performing a different operation. Such operations include film deposition, ion implantation, impurity diffusion, etching, etc., which are to performed in a processing chamber containing a suitable atmosphere. Each processing unit includes some type of support for securely holding the wafer in position for processing. Known supports include those that employ mechanical clamps, as disclosed in U.S. Pat. No. 4,603,466 issued to Morley, and those, which employ electrostatic forces, as disclosed in U.S. Pat. No. 5,103,367 granted to Horwitz et al., as well as in patents and publications cited therein. When articles such as semiconductor wafers are transferred from one unit to another by automated equipment, there is always the possibility of a malfunction that results in a failure to deliver an article to a support or incorrect positioning of the article on the support. Therefore, in installations of this type, it is desirable to monitor correct positioning of a wafer before the start of a processing operation.

U.S. Pat. No. 5,103,367, cited above, discloses an electrostatic chuck, in which voltages are applied to electrodes to produce electrostatic attraction forces. The voltages produce a current between each electrode and a reference electrode and the amplitude of the currents increases as a wafer is brought closer to the chuck. When the wafer is sufficiently close, these currents attain the amplitude, which produces a switching effect to increase the voltage applied to the electrodes, thereby substantially increasing the electrostatic attraction forces. Monitoring of wafer proximity according to this patent appears to be only for the purpose of determining when to apply an increased holding force, and it appears to be assumed that the wafer will be automatically placed in the correct position. There does not appear to be a provision for any alarm or other fault response if the wafer does not arrive at the correct position. Moreover, there does not appear to be any indication in this patent that the proximity sensing system could provide an indication if the wafer is on the chuck but is misaligned. If a wafer that has been placed on the surface of the chuck is somewhat warped, or bowed, then the electrostatic attraction force which must be applied to place the wafer flat against the upper surface of the chuck generally will require a higher value than that, which would be required for a perfectly flat wafer. It is therefore known to produce electrostatic attraction forces, which are higher than those required by a perfectly flat wafer. However, such increased electrostatic attraction forces can cause the lower surface of the wafer to become scratched, and thereby possibly produce particles which might circulate in the processing chamber and contaminate the upper surface of the wafer. Certain electrostatic chucks, which are known in the art, include passages, via which gas is supplied to the underside of a wafer mounted on the chuck in order to heat the wafer to processing temperature. The pressure of gas flowing through the passages may be monitored in order to determine whether a wafer is present on the chuck. Applied Materials, Inc., of Santa Clara, Calif., markets exemplary chucks of this type under the product designation PVD-ECHUCK.

Systems of this type have a number of advantages. However, these systems are not intended to be able to indicate that a wafer while present on the chuck is nonetheless incorrectly positioned, or has a piece broken off, or is warped so that only a portion of the wafer contacts the wafer support surface of the chuck. Another approach is to use capacitance to detect wafer position. For example, U.S. Pat. No. 5,436,790 issued to Blake et al. describes a wafer presence and clamp condition monitoring apparatus, which monitors capacitance between two electrodes embedded within a wafer support pedestal. The capacitance falls into one range with no wafer positioned upon the support surface and into a second range with a wafer in place but not clamped. Furthermore, the capacitance falls in a third range with the wafer held in place by an electrostatic chuck formed when the embedded pair of electrodes are energized with a DC voltage. The monitoring circuit senses when the capacitance of the system is in each of the ranges by converting the measured capacitance to a DC voltage that can easily be sensed and used to confirm wafer placement and clamping. Specifically, the electrostatic chuck used in the prior art system contains a pliable surface such that when the clamping force is applied, the wafer compresses the surface material and the wafer physically moves nearer to the pedestal surface and its embedded electrodes. This physical movement of the wafer relative to the electrodes causes a change in the capacitance between the electrodes.

Such pliable surface materials are typically useful primarily in low temperature semiconductor processing systems. At high temperatures, these materials tend to breakdown, outgas and/or deform. Thus, at high temperatures, an electrostatic chuck having a pliable surface may contaminate the chamber. Ceramic electrostatic chucks that are typically used in high temperature semiconductor wafer processing are constructed of a ceramic material that becomes somewhat conductive at high temperatures (i.e., the resistivity of the material decreases with increased temperature). Specifically, when the wafer rests flush against the surface of the chuck body while chucking voltage is applied to one or more embedded electrodes, the wafer is primarily retained against the ceramic support by the Johnsen-Rahbek effect. One example of such a ceramic chuck is disclosed in U.S. Pat. No. 5,117,121 issued to Watanabe et al. Ceramic chucks of this type have a hard, non-pliable surface that generally does not breakdown or deform during high temperature wafer processing.

However, capacitive sensors typically require that at least one electrical lead be brought into the interior of the processing chamber. Since the interior of the chamber must be isolated from the region surrounding the chamber, the need to provide a feedthrough for that lead presents additional design and fabrication complications. In addition, known capacitive sensors can sense the pressure of a wafer, but typically cannot reliably indicate if the wafer is correctly positioned.

U.S. Pat. No. 5,948,986 granted to Brown discloses a workpiece support assembly in a processing chamber. The assembly includes a support member having an upper surface to be contacted by a workpiece and a lower surface located opposite the upper surface. The assembly also includes a workpiece position monitoring system mounted on the lower surface and isolated from the interior of the chamber for detecting contact between the upper surface and a workpiece at each of a plurality of individual locations on the upper surface. The workpiece position monitoring system consists of a plurality of electroacoustic signal transducers mounted on the lower surface of the support member for generating acoustic waves in the support member and receiving reflected acoustic waves. The intensity of acoustic waves reflected from the upper surface is monitored to determine the position of a workpiece, such as a semiconductor wafer, on the support member.

Disclosed in U.S. Pat. No. 6,075,375 granted to Burkhart et al. are an apparatus and a method for detecting the presence and position of a wafer upon a semiconductor wafer support pedestal surface. Specifically, a wafer detector comprising a plurality of electrodes on a surface of the wafer support pedestal. The electrodes are coupled to a capacitance measurement circuit that measures the capacitance between the electrodes and generates a signal corresponding to a wafer's presence, location and chucking condition. The wafer's presence completes an electrical circuit between the electrodes, increasing the capacitance between the electrodes. As such, the presence of a wafer, the position of the wafer, and the condition of the wafer, i.e., wafer damage, can be detected upon a wafer support pedestal during wafer processing.

Looking at a common configuration for semiconductor processing equipment, a number of different processing chambers accessible from central wafer storage and handling ("transfer") chamber can be utilized. Wafers are typically loaded into the processing system in wafer cassettes and then the wafers are individually transferred from the cassettes to a wafer storage elevator within the central transfer chamber. A wafer transport robot moves individual wafers from the wafer storage elevator through the valves in the transfer chamber wall, into the different processing chambers, and then between chambers to effect different processing steps. Movement of semiconductor wafers within the processing equipment is accomplished using automated wafer handling techniques to allow for the complete automation of the fabrication process. Because wafer processing occurs in a vacuum environment and cost considerations necessitate fast pumping times to facilitate high wafer throughput, the total volume of a wafer processing system is limited. Consequently, the clearances and tolerances within a wafer processing equipment are typically limited by space considerations.

For example, one type of wafer storage elevator stores wafers in a recess that allows only a few millimeters of clearance to either side of the wafer. Misaligned wafers may be dislodged from the wafer storage elevator or may be damaged in other ways. Considering the complexity of semiconductor devices and the number of devices on each wafer, each wafer represents a substantial investment, and any level of wafer breakage is undesirable. Accordingly, wafer transfers must be precise. Normally, stepper motor driven wafer transport robots under computer control are capable of repeatedly transporting wafers through a processing system with great precision. However, the effectiveness of such wafer handling techniques can be greatly diminished if the initial wafer position with respect to the wafer transport robot is not known accurately. Conventionally, the wafer transport robots use a vacuum pickup method to hold the wafer and capacitive sensors to detect the presence of the wafer on a wafer-carrying blade, commonly referred to as the "blade." The capacitive position sensors within the blade of the wafer transport robot are used to detect if the wafer is improperly seated on the blade. Such capacitive systems are often inaccurate and fail to detect most wafer misalignment problems. The elimination of the vacuum pickup and their capacitive sensors has required the need for a different wafer detection and correction scheme. Some types of wafer processing equipment use one or more techniques to measure a wafer's position and to ensure that the wafer is situated at a predefined position.

For example, U.S. Pat. No. 4,819,167 issued to Cheng, et al., describes a wafer processing system, which includes a sensor array for determining the position of a wafer as it is loaded from an external cassette onto an internal wafer storage elevator. The Cheng wafer positioning system ensures that wafers loaded into the processing equipment are accurately positioned on a given level of the wafer storage elevator. Using a system in accordance with the teachings of the Cheng patent ensures that wafers stored within the wafer storage elevator are initially at a well defined position with respect to the wafer transport robot when the wafers are accessed by the wafer transport robot. Systems, which incorporate the teachings of the Cheng patent, nevertheless experience unacceptable levels of wafer breakage. These unacceptable levels are likely caused by inaccurate wafer accessing operations or by wafers being dislodged from their nominal position either during processing or transport. Thus, further measures are desirable to ensure that wafers are at their predetermined positions.

A second type of center finding system is described in U.S. Pat. No. 5,483,138, which lists Shmookler, et al., as inventors (hereinafter, the "Shmookler system"). The Shmookler system is a wafer center finding system, which uses four photoelectric position sensors to locate the center of a wafer as the wafer is moved between process chambers. An array of optical sources is disposed above the central wafer transport chamber, and a corresponding array of optical detectors is disposed below the chamber. The illustrated sensor array allows the identification of wafer positions, but requires that the wafer transport chamber be optically accessible from both the top and the bottom of the chamber. This photoelectric sensor array is arranged so that the light travels along a path generally perpendicular to the plane, in which the wafer is transported. In practice, this type of sensor geometry may lead to erroneous position information due to multiple reflections from the surfaces of the top and bottom chamber covers and from the wafer. To compensate for such erroneous position data, the Shmookler system samples more data points than is necessary, discarding data that does not fall within expected limits. The Shmookler system uses a data collection scheme, which relies on particular points on the edge of a wafer crossing the four sensor array in a particular order. This scheme works well when wafers are positioned near to their nominal position. However, wafers that are in danger of breaking in the course of a transport operation may be dislodged from their nominal position by a large amount. For such substantially misaligned wafers, the Shmookler system will not appropriately identify the wafer position, and the wafers that are substantially out of position may consequently be broken.

U.S. Pat. No. 5,098,194 granted to Freerks, et al., discloses a wafer position error detection and correction system that determines the presence of a wafer on a wafer transport robot blade. The system also determines a wafer position error by monitoring the position of the wafer with respect to the blade with one sensor, which is located proximate to each entrance of a process chamber. When a wafer position error is detected, the system determines the extent of the misalignment and corrects such misalignment if correctable by the wafer transport robot or alerts an operator for operator intervention. The system incorporates a transparent cover on the surface of the wafer handling chamber and four optical detection sensors disposed on the surface of the transparent cover, in which each sensor is placed proximate to the entrance of the process chamber. In addition, an I/O sensor is placed adjacent the I/O slit valve to detect and correct wafer position errors. The detection sensors direct light through the wafer handling chamber to reflectors on the floor of the transfer chamber, which reflect the light back to the detector sensors. A detector within the detector sensor detects when the beam path from the position sensor to the reflector is uninterrupted. As a wafer is retracted out of a process chamber or a wafer cassette, the position of the wafer with respect to the blade is measured, thus determining whether the wafer is properly placed on the wafer.

One more instance posing the above-discussed problem is vacuum chambers for workpieces, particularly wafers used in semiconductor manufacture, that usually include a workpiece holder. In a vacuum load lock chamber, the workpiece holder transports the wafer between a vacuum processing chamber and cassette at atmospheric pressure. In a vacuum-processing chamber the wafer is delivered to a stationary wafer holder. It is necessary to signal when a workpiece is properly positioned on workpiece holders in vacuum load locks. Some of the prior art techniques used to determine the presence and absence of workpieces on workpiece holders in vacuum chambers have involved providing the chamber with an optically transparent window and mounting an optical transmitter and receiver on or in proximity to the window. Such arrangements are advantageous because the optical transmitter, i.e., source, and receiver are outside the vacuum chamber. Accordingly, the optical source and receiver do not interfere with operations occurring within the sealed vacuum chamber, do not outgas possible workpiece contaminating particles into the chamber, and are not subject to the possibly deleterious, corroding environment inside the chamber. As a result, costly downtime of the vacuum chamber is reduced.

In one such arrangement, the optical transmitter emits a beam of optical energy that propagates obliquely through the window to the workpiece holder. When no workpiece is on the holder, the beam is incident on a reflector fixedly mounted on the workpiece holder, in a flange for supporting the workpiece. The reflector is oriented so the optical beam incident on it is reflected back to the receiver via a path virtually identical to the path from the transmitter to the reflector. When a workpiece is on the holder, the beam is supposed to be reflected so its angle of incidence and reflection are the same. Thereby, no optical energy is incident on the receiver when a workpiece is on the holder.

A problem with this prior art arrangement is that some semiconductor wafers in the vacuum chamber have patterns that substantially duplicate the reflecting properties of the reflector mounted on the workpiece holder flange. When such a wafer is on the workpiece holder, optical energy in the beam from the transmitter is reflected back to the optical receiver, causing the optical receiver to generate a signal falsely indicating that no wafer is on the workpiece holder obviously, this prior art arrangement cannot be used to detect the presence and absence of such wafers on the workpiece holder. In load lock wafer holders, the false signal indicates a wafer is on the holder when this is not the case, to reduce wafer throughput in a vacuum system including the load lock. Catastrophic results can also occur in response to the false indication because a wafer on the holder is likely to be broken by a wafer transfer mechanism moving another wafer to the process chamber while a wafer is actually in the process chamber. In another optical detecting arrangement, a laser emits a highly collimated beam, which is directed to be incident on an edge of a wafer that is properly in place on the workpiece holder. The wafer edge reflects the laser beam back to a detector via a path that is virtually coincident with the path from the laser to the edge. When no wafer is on the workpiece holder, no reflection occurs and no optical energy from the laser is incident on the detector. While this arrangement is extremely reliable, it is quite expensive because of the laser cost.

In U.S. Pat. No. 5,796,486 issued to Jacob, the presence and absence of a semiconductor wafer on a wafer holder in a vacuum chamber having an optically transparent window is detected by an optical system including a source of optical energy positioned outside the chamber and a receiver for the optical energy positioned outside the chamber. A light path extends from the source through the window and an opening in the wafer holder when no wafer is on the wafer holder. The optical path is bent downstream of the wafer holder, thence continues back through another opening in the wafer holder, and through the window to the receiver. The optical receiver is positioned and arranged so optical energy reflected from a wafer (even a wafer having dispersive mirror properties) in situ on the wafer holder cannot be reflected or otherwise incident on the optical receiver. The optical receiver thus has optical energy from the source incident on it when no wafer is present on the wafer holder and no optical energy from the source is incident on the receiver when a wafer is on the wafer holder.

Also known in prior art and shown in FIGS. 1 and 2 is a wafer presence sensor for a transfer chamber. The chamber 10, a cutout portion of which is shown in FIGS. 1 and 2, comprises a chamber lid 12 with a transparent window 14 and a chamber bottom 16, a wafer 18 being placed in the chamber in the plane parallel to the lid and the bottom. The sensor 20 placed in front of the window 14 comprises means 22 for emitting a sensing beam 24 and means 26 for receiving a reflected beam 28.

The drawback of this type of the sensor lies in the following. As the wafer 18 is moved to the right position, the sensor 20 will emit a light beam 24. If the wafer 18 is really under the sensor 20, the beam 24 will be reflected by the wafer and the receiver 26 will catch the reflected beam. However, the gain value is hard to adjust for the following reason. If the gain value is too low (FIG. 1), there will be no reflected beam to trigger the receiver 26, and the sensor 20 will consider "no wafer" status even if there is a wafer in the chamber 10. On the other hand, if a higher gain value is adjusted, the receiving means 26 may receive a signal 28 (FIG. 2) reflected from an inner surface 30 of the chamber bottom 16 even where the wafer 18 is absent.

SUMMARY OF THE INVENTION

Bearing in mind the problems and deficiencies of the prior art, it is therefore an object of the present invention to provide a semiconductor wafer presence optical sensor, which, possessing the advantages of prior art wafer presence sensors, would be free of their drawbacks.

Specifically, the object of the present invention is to provide an optical sensor system that overcomes the problem of false sensing.

According to the invention, a wafer presence optical sensor system comprises a transfer chamber, an optical sensor, and means to reflect away a sensing beam when reaching the bottom of the chamber. The chamber, which receives a wafer, also has a chamber lid with a transparent window provided therein. The optical sensor comprises means emitting the sensing beam and means receiving a beam reflected from the wafer to ascertain wafer presence in the chamber. The sensor is adjusted relative to the chamber lid so as to let the sensing beam and the reflected beam pass through the window. In such a system, the misinterpretation of wafer presence in the chamber, which may take place when the beam is reflected from the chamber bottom and is received by the receiving means, is thwarted.

The wafer is positioned in the chamber parallel to planes of the chamber lid and the chamber bottom.

The reflecting means is proposed to include an oblique area on an inner surface of the chamber bottom.

The oblique area may include a ledge in the inner surface of the chamber bottom.

Preferably, the oblique area is shaped at an angle of about 45°.

Alternatively, the reflecting means may include a body, whose surface is oblique relative to the sensing beam, the body being placed on the chamber bottom.

Specifically, this body may be shaped in a triangular fixture.

It is preferable to have the oblique area of the inner surface of the chamber bottom and the oblique surface of the triangle fixture polished.

BRIEF DESCRIPTION OF THE DRAWINGS

The above objects and advantages of the present invention will become more apparent from an ensuing description of a preferred embodiment thereof with reference to the attached drawings, in which.

DETAILED DESCRIPTION OF THE PREFERRED EMBODIMENTS

Figure 1:
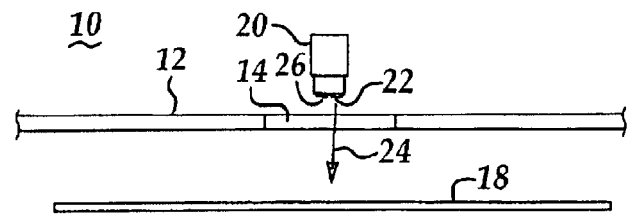
FIG. 1 schematically illustrates a prior art optical sensor with a low gain value and a semiconductor wafer present in a chamber.
Figure 2:
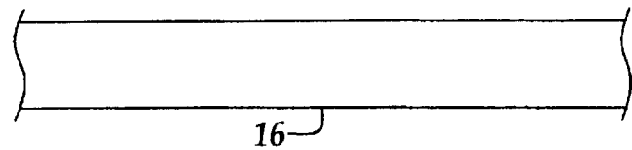
FIG. 2 schematically shows a prior art optical sensor with a high gain value and a semiconductor wafer absent from the chamber.
Figure 2:
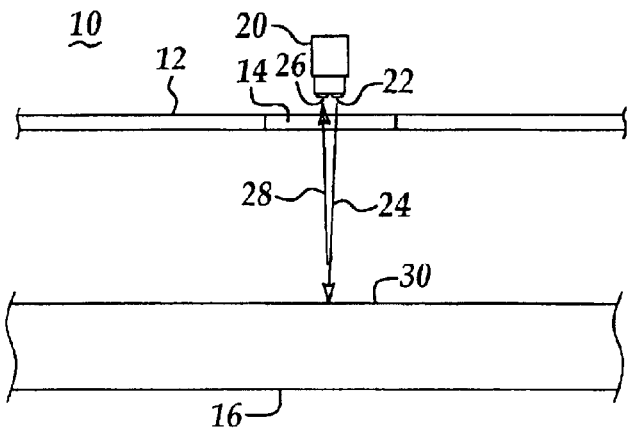
Figure 3:
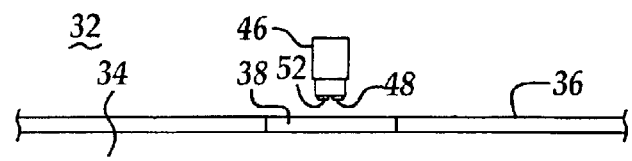
FIG. 3 schematically illustrates a wafer presence optical sensor system according to the principles of the present invention.
Figure 3:
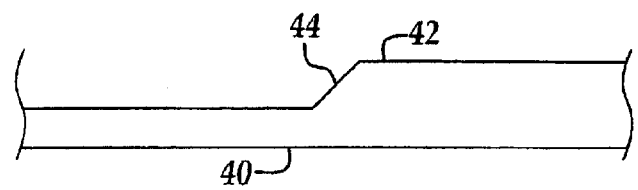
Figure 4:
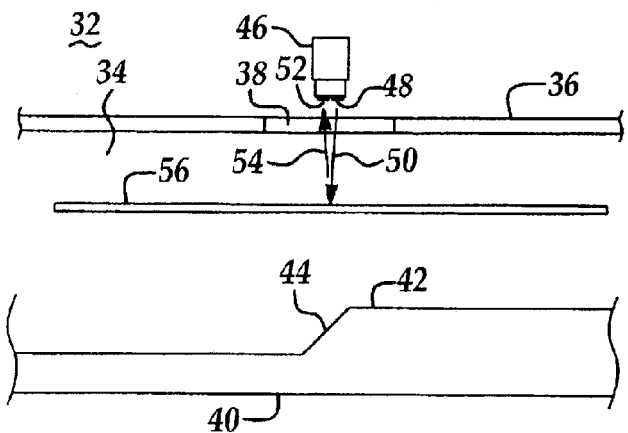
FIG. 4 schematically shows the wafer presence optical sensor system according to the principles of the present invention in the case where the wafer is present in the chamber.
Figure 5:
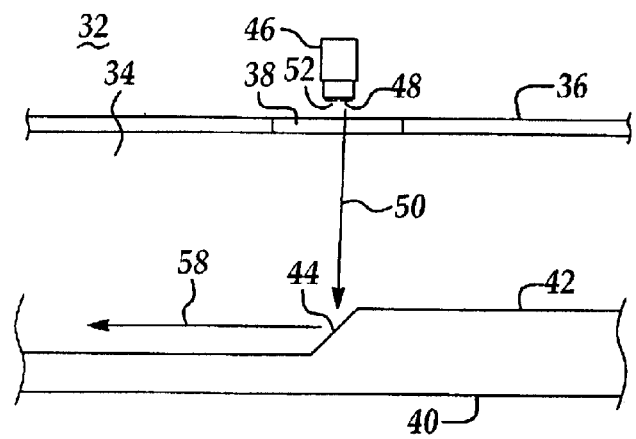
FIG. 5 schematically illustrates the wafer presence optical sensor system according to the principles of the present invention in the case where the wafer is absent from the chamber.

Referring now to FIGS. 3–5, a wafer presence optical sensor system 32 in accordance with the present invention comprises a transfer chamber 34 with a lid 36 having a transparent window 38 and a bottom 40. An inner surface 42 of the bottom 40 is made oblique in an area 44 opposite to the window 38. An optical sensor 46 is provided with emitting means 48 generating a beam 50 and means 52 receiving a reflected beam 54. A wafer 56, whose presence in the chamber 34 is to be ascertained by the system 32, is placed into the chamber in such a way that its plane is substantially parallel to planes of the lid 36 and the bottom 40.

The sensor 44 is positioned in front of the window 38 so that the beams 50 and 54 are allowed to pass through the window 38. The oblique area 44 made as a ledge at the bottom 40 is polished to enhance its reflectivity and minimize scattering. Preferably, the angle, at which the area 44 goes down, is about 45°.

When the wafer 56 is placed into the chamber 34 (FIG. 4), the impinging beam 50 generated by the emitting means 48 of the sensor 46 is reflected by the wafer 56 and as the reflected beam 54 comes back to the sensor 46 where it is received by the receiving means 52.

The emitting of the beam 50 and receiving of the beam 54 evidences that the wafer 56 is in the chamber 34.

When there is no wafer in the chamber 34 (FIG. 5), the beam 50 reaches the area 44 and as a beam 58 is reflected away out of the chamber 34, not returning to the sensor 46. The emitting of the beam 50 and receiving no beam by the receiving means 52 evidences that the wafer is absent from the chamber 34. It is to be understood that gain value of the emitting means 48 is selected high enough for the beam 50 to reach the wafer 56 in the first scenario and the area 44 in the second one.

Figure 6:
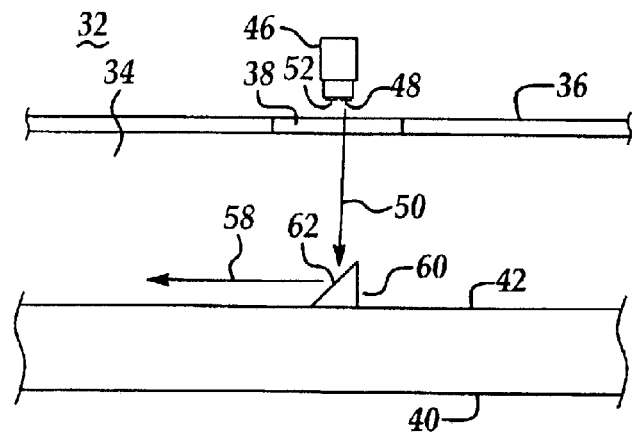
FIG. 6 schematically depicts another embodiment of the wafer presence optical sensor system according to the principles of the present invention.

FIG. 6 illustrates another embodiment of the present invention. The concept of reflecting the beam 50 away out of the chamber 34 is preserved, but the specific reflecting means is different. A triangular block 60 with an oblique surface 62 is provided. In a similar fashion, when there is no wafer in the chamber 34, the beam 50 reaches the area 62 and as a beam 58 is reflected away out of the chamber 34, not returning to the sensor 46. The emitting of the beam 50 and receiving no beam by the receiving means 52 evidences that the wafer is absent from the chamber 34.

Though the present invention has been fully described in the foregoing preferred embodiments, it is to be clearly understood that various modifications apparent to those skilled in the art can be made without departing from the spirit and scope of the invention. All of these modifications are therefore construed as being covered by the claims that follow.

What is claimed is:

1. A wafer presence optical sensor system comprising:
a transfer chamber adapted to receive a wafer, said transfer chamber comprising a chamber lid and a chamber bottom having an inner surface, said chamber lid being provided with a transparent window;
an optical sensor comprising means for emitting a sensing beam and means for receiving a beam reflected from said wafer to ascertain wafer presence in said chamber, said sensor being adjusted relative to said chamber lid so as to let said sensing beam and said reflected beam pass through said window; and
means for reflecting said sensing beam away from said means for receiving a beam when said sensing beam reaches said chamber bottom, said means for reflecting said sensing beam having a surface oblique relative to the sensing beam, said surface forming coincident to an area of the inner surface of the chamber bottom and forming a non-planar surface therewith,
whereby receipt by said receiving means of said beam reflected from said non-planar surface of said reflecting means of chamber bottom is prevented, and thus misinterpretation of wafer presence is thwarted.

2. The wafer presence optical sensor system according to claim 1, wherein said reflecting means includes an oblique area on an inner surface of said chamber bottom.

3. The wafer presence optical sensor system according to claim 2, wherein said oblique area includes a ledge in said inner surface of said chamber bottom.

4. The wafer presence optical sensor system according to claim 2, wherein said oblique area is shaped at an angle of about 45°.

5. The wafer presence of optical sensor system according to claim 2, wherein said oblique area is polished.

6. The wafer presence optical sensor system according to claim 1, wherein said reflecting means includes a body placed on said chamber bottom, said body having a surface oblique relative to said sensing beam.

7. The wafer presence optical sensor system according to claim 6, wherein said body includes a triangular fixture.

8. The wafer presence optical sensor system according to claim 1, wherein said wafer is positioned in said chamber parallel to planes of said chamber lid and said chamber bottom.

9. A wafer presence optical sensor system comprising:
a transfer chamber adapted to receive a wafer, said transfer chamber comprising a chamber lid and a chamber bottom, said chamber lid being provided with a transparent window; and
an optical sensor comprising means for emitting a sensing beam and means for receiving a beam reflected from said wafer to ascertain wafer presence in said chamber, said sensor being adjusted relative to said chamber lid so as to let said sensing and said reflected beam pass through said window,
wherein an inner surface of said chamber bottom is made with an oblique area relative to the sensing beam to thereby reflect away said sensing beam when reaching said bottom,
whereby said receiving means does not receive said reflected away sensing beam from said chamber bottom and thus misinterpretation of wafer presence is thwarted.

10. The wafer presence optical sensor system according to claim 9, wherein said oblique area includes a ledge in said inner surface of said chamber bottom.

11. The wafer presence optical sensor system according to claim 10, wherein said oblique area is shaped at an angle or about 45°.

12. The wafer presence optical sensor system according to claim 9, wherein said oblique area is polished.

13. The wafer presence optical sensor system according to claim 9, wherein said wafer is positioned in said chamber parallel to planes of said chamber lid and said chamber bottom.

14. A wafer presence optical sensor system comprising:
a transfer chamber adapted to receive a wafer, said transfer chamber comprising a chamber lid and a chamber bottom, said chamber lid being provided with a transparent window; and
an optical sensor comprising means for emitting a sensing beam and means for receiving a beam reflected from said wafer to ascertain wafer presence in said chamber, said sensor being adjusted relative to said chamber lid so as to let said sensing beam and said reflected beam pass through said window;
wherein an inner surface of said chamber bottom is provided with a body placed on said chamber bottom, said body having a surface oblique relative to said sensing beam,
whereby receipt receiving by said receiving means of said beam reflected from said chamber bottom is prevented, and thus misinterpretation of wafer is thwarted.

15. The wafer presence optical sensor system according to claim 14, wherein said body includes a triangular fixture.

16. The wafer presence optical sensor system according to claim 14, wherein said oblique surface is shaped at an angle of about 45°.

17. The wafer presence optical sensor system according to claim 14, wherein said oblique surface is polished.

18. A wafer presence optical sensor system consisting essentially of:
a transfer chamber adapted to receive a wafer, said transfer chamber comprising a chamber lid and a chamber bottom having an inner surface, said chamber lid being provided with a transparent window;
an optical sensor comprising means for emitting a sensing beam and means for receiving a beam reflected from said wafer to ascertain wafer presence in said chamber, said sensor being adjusted relative to said chamber lid so as to let said sensing beam and said reflected beam pass through said window; and
means for reflecting said sensing beam away from said means for receiving a beam when said sensing beam reaches said chamber bottom, said means for reflecting said sensing beam having a surface oblique relative to the sensing beam, said surface forming coincident to an area of the inner surface of the chamber bottom and forming a non-planar surface therewith,
whereby receipt by said receiving means of said beam reflected from said non-planar surface of said reflecting means of chamber bottom is prevented, and thus misinterpretation of wafer presence is thwarted.

* * * * *